(12) United States Patent
Riepen et al.

(10) Patent No.: US 8,345,218 B2
(45) Date of Patent: Jan. 1, 2013

(54) IMMERSION LITHOGRAPHIC APPARATUS, DRYING DEVICE, IMMERSION METROLOGY APPARATUS AND DEVICE MANUFACTURING METHOD

(75) Inventors: Michel Riepen, Veldhoven (NL); Nicolaas Rudolf Kemper, Eindhoven (NL); Johannes Petrus Martinus Bernardus Vermeulen, Helmond (NL); Daniel Jozef Maria Direcks, Simpelveld (NL); Danny Maria Hubertus Philips, Son en Breugel (NL); Arnold Jan Van Putten, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 627 days.

(21) Appl. No.: 12/437,466

(22) Filed: May 7, 2009

(65) Prior Publication Data

US 2009/0279063 A1 Nov. 12, 2009

Related U.S. Application Data

(60) Provisional application No. 61/071,620, filed on May 8, 2008, provisional application No. 61/071,876, filed on May 22, 2008.

(51) Int. Cl.
*G03B 27/52* (2006.01)
(52) U.S. Cl. .......................................... 355/30; 355/67
(58) Field of Classification Search .................. 355/30, 355/50, 53, 67
See application file for complete search history.

(56) References Cited

U.S. PATENT DOCUMENTS

| | | | |
|---|---|---|---|
| 4,509,852 A | 4/1985 | Tabarelli et al. | |
| 7,423,720 B2* | 9/2008 | Verspay et al. | 355/30 |
| 7,443,482 B2 | 10/2008 | Novak et al. | |
| 7,561,248 B2* | 7/2009 | Nakano | 355/30 |
| 7,602,470 B2 | 10/2009 | Kemper et al. | |
| 7,710,537 B2* | 5/2010 | Verspay et al. | 355/30 |
| 7,839,483 B2 | 11/2010 | Leenders et al. | |
| 7,924,416 B2 | 4/2011 | Hikima | |
| 7,932,989 B2 | 4/2011 | Novak et al. | |
| 2004/0136494 A1 | 7/2004 | Lof et al. | |
| 2004/0207824 A1 | 10/2004 | Lof et al. | |
| 2005/0213066 A1 | 9/2005 | Sumiyoshi | |
| 2006/0023183 A1* | 2/2006 | Novak et al. | 355/53 |
| 2006/0087630 A1 | 4/2006 | Kemper et al. | |
| 2006/0103821 A1* | 5/2006 | Verspay et al. | 355/53 |
| 2006/0119809 A1 | 6/2006 | Verhagen et al. | |

(Continued)

FOREIGN PATENT DOCUMENTS

EP 1420298 A2 5/2004

(Continued)

OTHER PUBLICATIONS

European Search Report dated Oct. 11, 2010 in related European patent application No. 09159532.2-1226.

(Continued)

*Primary Examiner* — Thomas R Artman
(74) *Attorney, Agent, or Firm* — Pillsbury Winthrop Shaw Pittman LLP

(57) ABSTRACT

An immersion lithographic apparatus is described in which a liquid removal device is arranged to remove liquid from the substrate, e.g. during exposures, through a plurality of elongate slots arranged along a line and angled to that line. The liquid removal device may act as a meniscus pinning device in an immersion hood or may be used in a drying device to remove a droplet from the substrate.

20 Claims, 8 Drawing Sheets

U.S. PATENT DOCUMENTS

| | | | |
|---|---|---|---|
| 2006/0164616 A1* | 7/2006 | Okada | 355/53 |
| 2006/0187427 A1 | 8/2006 | Stavenga et al. | |
| 2006/0291060 A1* | 12/2006 | Shirai et al. | 359/582 |
| 2007/0030464 A1 | 2/2007 | Kemper et al. | |
| 2007/0081140 A1 | 4/2007 | Beckers et al. | |
| 2007/0097341 A1 | 5/2007 | Hikima | |
| 2007/0146666 A1 | 6/2007 | Leenders et al. | |
| 2007/0247600 A1* | 10/2007 | Kobayashi et al. | 355/30 |
| 2007/0268466 A1* | 11/2007 | Leenders et al. | 355/30 |
| 2008/0007704 A1* | 1/2008 | Leenders et al. | 355/30 |
| 2008/0212046 A1* | 9/2008 | Riepen et al. | 355/30 |
| 2008/0266533 A1* | 10/2008 | Nagasaka et al. | 355/30 |
| 2009/0279062 A1* | 11/2009 | Direcks et al. | 355/30 |
| 2010/0195067 A1* | 8/2010 | Nagasaka et al. | 355/30 |
| 2011/0134400 A1* | 6/2011 | Shibazaki | 355/30 |

FOREIGN PATENT DOCUMENTS

| | | |
|---|---|---|
| EP | 1420300 A2 | 5/2004 |
| EP | 1571698 | 7/2005 |
| EP | 1677156 | 5/2006 |
| JP | 2004-259966 | 9/2004 |
| JP | 2005-191344 | 7/2005 |
| JP | 2006-060223 | 3/2006 |
| JP | 2006-523029 | 10/2006 |
| JP | 2007-142460 | 6/2007 |
| JP | 2007-194613 | 8/2007 |
| KR | 10-2006-0093676 | 8/2006 |
| KR | 10-2008-0017299 | 2/2008 |
| WO | 99/49504 A1 | 9/1999 |
| WO | 2005/064405 A2 | 7/2005 |
| WO | 2005/081290 | 9/2005 |
| WO | 2006/101120 | 9/2006 |

OTHER PUBLICATIONS

Korean Office Action dated Feb. 14, 2011 in corresponding Korean Patent Application No. 10-2009-0040484.

U.S. 7,443,482, Oct. 26, 2010, Novak et al., (withdrawn).

Japanese Office Action mailed Aug. 1, 2011 in corresponding Japanese Patent Application No. 2009-112621.

Chinese Office Action dated Feb. 3, 2012 in corresponding Chinese Patent Application No. 200910141992.9.

Singapore Written Opinion and Search Report dated Aug. 1, 2012 in corresponding Singapore Patent Application No. 201103843-7.

Chinese Office Action dated Oct. 25, 2012 in corresponding Chinese Patent Application No. 200910140581.8.

Japanese Office Action mailed Nov. 8, 2012 in corresponding Japanese Patent Application No. 2009-113348.

* cited by examiner

Fig. 2
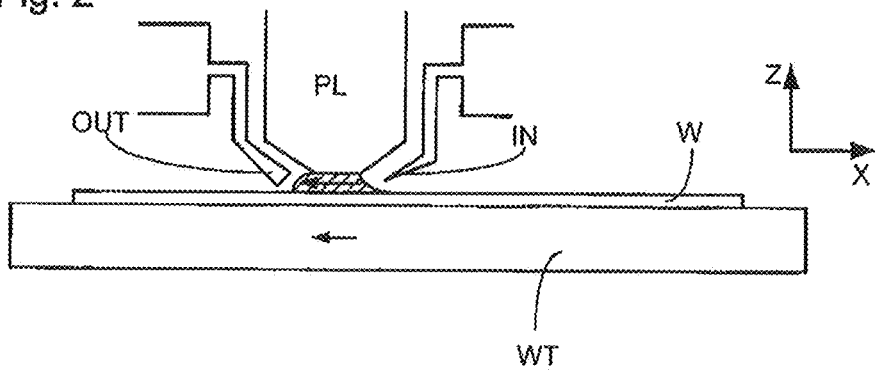
Fig. 3
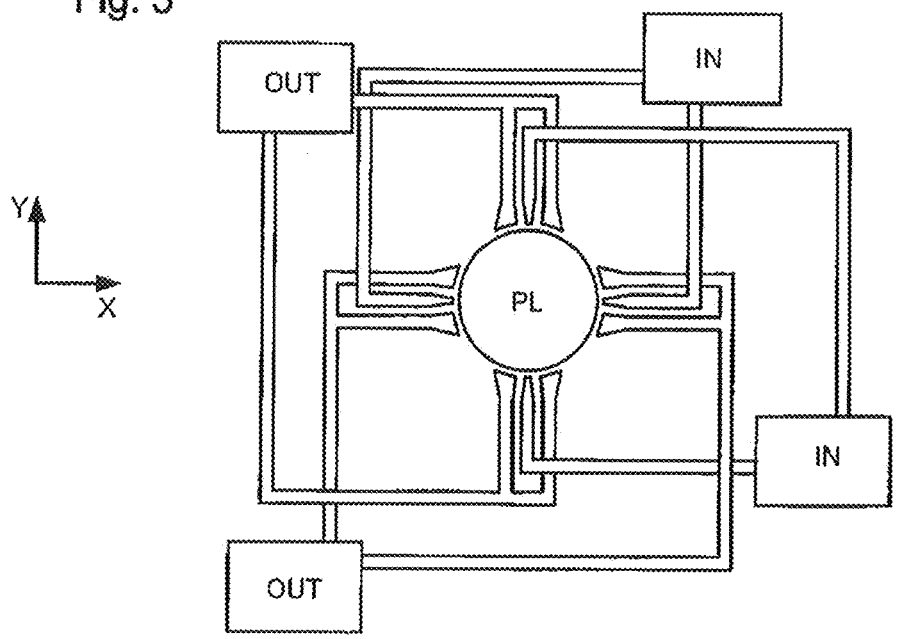
Fig. 4
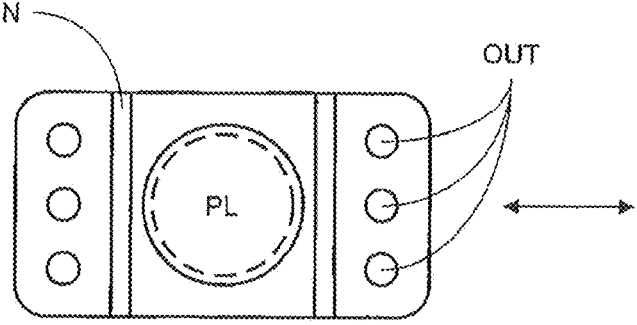
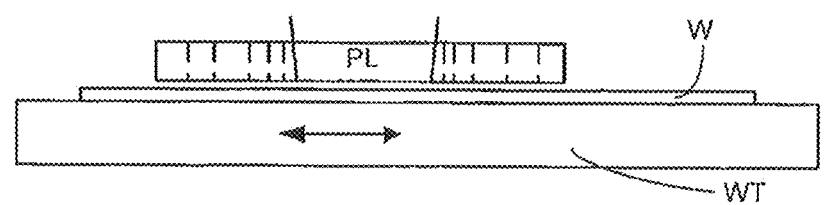

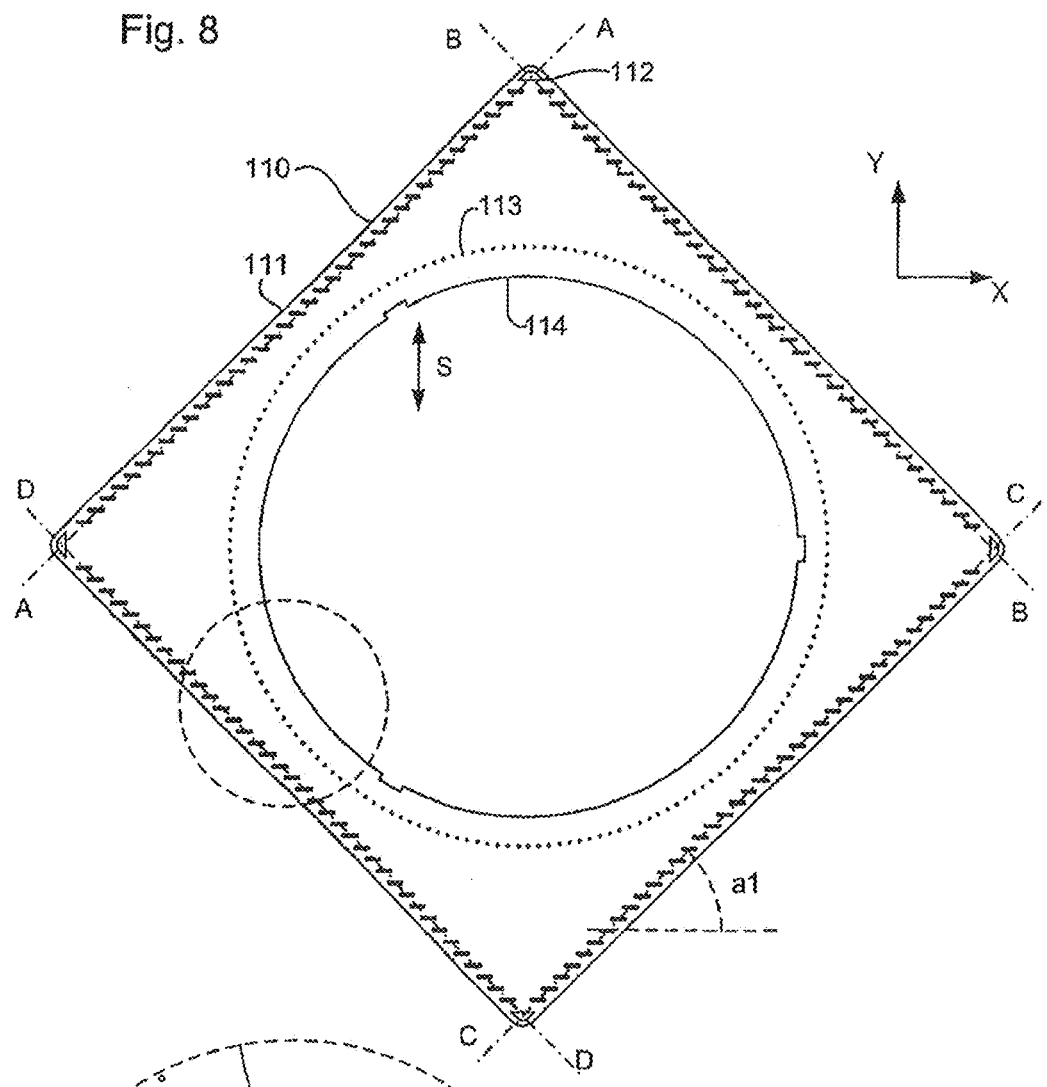

IMMERSION LITHOGRAPHIC APPARATUS, DRYING DEVICE, IMMERSION METROLOGY APPARATUS AND DEVICE MANUFACTURING METHOD

This application claims priority and benefit under 35 U.S.C. §119(e) to U.S. Provisional Patent Application No. 61/071,620, entitled "Immersion Lithographic Apparatus, Drying Device, Immersion Metrology Apparatus and Device Manufacturing Method", filed on May 8, 2008, and to U.S. Provisional Patent Application No. 61/071,876, entitled "Immersion Lithographic Apparatus, Drying Device, Immersion Metrology Apparatus and Device Manufacturing Method", filed on May 22, 2008. The content of each of the foregoing applications is incorporated herein in its entirety by reference.

FIELD

The present invention relates to a liquid removal device, in particular that can be used in or in conjunction with a lithographic apparatus or a metrology apparatus, as well as a method for liquid removal and device manufacture.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers and so-called scanners. In a stepper each target portion is irradiated by exposing an entire pattern onto the target portion at one time. In a scanner each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic e.g. Decalin, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid handling system, such as a liquid supply system, to provide liquid on only a localized area of the substrate and in between the final element of the projection system and the substrate using a liquid confinement structure (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, desirably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the patterned beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another arrangement which has been proposed is to provide a liquid handling system with a barrier member which extends along at least a part of a boundary of the space between the final element of the projection system and the substrate table. In an embodiment, the barrier member may form or be part of a seal, near which is a meniscus of the immersion liquid. The seal may confine the immersion liquid and so create the meniscus. As exposure radiation passes through the confined immersion liquid it may be considered optical liquid. Such an arrangement is illustrated in FIG. 7 and will be described in more detail below. The barrier member is substantially stationary relative to the projection system in the XY plane though there may be some relative movement in the Z direction (in the direction of the optical axis). In an embodiment, a seal is formed between the seal member and the surface of the substrate. Desirably the seal is a contactless seal such as a gas seal. Such a system with a gas seal is disclosed in United States patent application publication no. US 2004-0207824 and illustrated in FIG. 7.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system substantially the whole top surface of the substrate is covered in liquid. This may be advantageous because then the substantially whole top surface of the substrate is exposed to the substantially same conditions. This has an advantage for temperature control and processing of the substrate. In WO 2005/064405, a liquid supply system provides liquid to the gap between the final element of the projection system and the substrate. The liquid between the final element of the projection system and the substrate during exposure is optical liquid. That liquid is allowed to leak over the remainder of the substrate. A barrier at the edge of a substrate table prevents the liquid from escaping so that it can be removed from the top surface of the substrate table in a controlled way. The meniscus of the liquid defining the extent of the immersion liquid is remote from the projection system. Although such a system improves temperature control and processing of the substrate, evaporation of the immersion liquid may still occur. One way of helping to alleviate that problem is described in United States patent application publication no. US 2006/0119809 in which a member is provided which covers the substrate W in all positions and which is arranged to have immersion liquid extending between it and the top surface of the substrate and/or substrate table which holds the substrate.

SUMMARY

In an immersion lithography apparatus, especially for localized immersion, one factor limiting the throughput of the apparatus is the stability of the meniscus of the immersion liquid. At increased relative speeds between the projection system and the substrate table, the meniscus becomes unstable. With higher relative speeds, the forces and acceleration applied to the relatively moving components and the meniscus increase. Such a meniscus is the meniscus located between the liquid handling system that provides the immersion liquid and a substrate on the substrate table. An unstable meniscus may allow bubbles to enter the immersion liquid and droplets of immersion liquid to break away. Such droplets left on the substrate can cause various problems as discussed further below.

In both localized and non-localized immersion systems a droplet or film of liquid can be left on the substrate either after the substrate has passed the final element and the associated optical liquid or when the substrate is removed from the exposure station. References to a droplet of liquid herein encompass additionally or alternatively a film of liquid. A film may be considered to be a droplet which is in the form of a thin layer covering a part of a surface. If left to evaporate, the droplet can cause localized cooling and deformation of the substrate. Dissolved and suspended contaminants may be deposited on the substrate. Such a droplet may be a source of defectivity (i.e. defect count density) in attracting contaminants. If a localized liquid confinement structure is employed, an additional problem can arise. Bubbles may form, for example, in the immersion liquid between the substrate surface and the projection system when a droplet on the substrate surface contacts and impacts the meniscus of the immersion liquid under the projection system. The droplet may be stationary relative to the substrate, but move relative to the confinement structure. The risk of collision between a droplet on the substrate surface and the meniscus may increase after a change of direction of relative motion between the substrate and the confinement structure for example when changing scanning direction. Existing droplet removal devices work using a gas flow to drag a droplet towards an extraction opening, i.e. outlet, however the high speed gas flow in such devices can lead to increased evaporation, thus exacerbating the associated cooling.

It is desirable to provide an improved apparatus by which a meniscus can be stabilized and/or a liquid droplet can be more effectively removed from the surface of the substrate.

According to an aspect of the invention, there is provided a lithographic apparatus comprising:

a substrate table constructed to hold a substrate; and a liquid handling structure arranged to remove liquid from a surface of the substrate table, a substrate held by the substrate table, or both the substrate table and the substrate, the liquid handling structure comprising an array of liquid extraction openings arranged along a line, each of the liquid extraction openings being elongate in a respective direction of elongation and the directions of elongation being at an angle of greater than 0 to the line.

According to an aspect of the invention, there is provided a lithographic apparatus comprising:

a substrate table constructed to hold a substrate;

a projection system configured to project a patterned radiation beam onto a target portion of the substrate, the projection system having an optical axis;

a positioner arranged to effect relative movement between the substrate table and the projection system;

a control system arranged to control the positioner to move the substrate table relative to the projection system in a scan direction during exposure of a target portion of a substrate by projection of the radiation beam thereon; and a liquid handling structure arranged to remove liquid from a surface of the substrate table, a substrate held by the substrate table, or both the substrate table and the substrate, the liquid handling structure comprising a plurality of elongate liquid extraction openings, the liquid extraction openings being spaced apart and each liquid extraction opening overlapping at least one adjacent liquid extraction opening such that a line extending substantially parallel to the scan direction from a point in the region where the patterned beam is incident on the substrate passes underneath at least two of the liquid extraction openings.

According to an aspect of the invention, there is provided a lithographic apparatus comprising:

a substrate table constructed to hold a substrate;

a projection system configured to project a patterned radiation beam onto a target portion of the substrate;

a positioner arranged to effect relative movement between the substrate table and the projection system;

a control system arranged to control the positioner to move the substrate table relative to the projection system in a scan direction during exposure of a target portion of a substrate by projection of the radiation beam thereon; and a liquid handling structure arranged to remove liquid from a surface of the substrate table, a substrate held by the substrate table, or both the substrate table and the substrate, the liquid handling structure comprising a plurality of elongate liquid extraction openings arranged opposite the surface, the arrangement of liquid extraction openings being such that, when the liquid extraction openings are in fluid communication with a source of under pressure, a plurality of low pressure regions are formed between the surface and the liquid handling structure, the low pressure regions being elongate, spaced apart and each overlapping at least one adjacent low pressure region such that a line extending substantially parallel to the scan direction from a point in the region where the patterned beam is incident on the substrate passes through at least two of the low pressure regions.

According to an aspect of the invention, there is provided a lithographic apparatus comprising:

a substrate table constructed to hold a substrate;

a projection system configured to project a patterned radiation beam onto a target portion of the substrate, the projection system having an optical axis;

a positioner arranged to effect relative movement between the substrate table and the projection system;

a control system arranged to control the positioner to move the substrate table relative to the projection system in a scan direction during exposure of a target portion of a substrate by projection of the radiation beam thereon; and a liquid handling structure arranged to remove liquid from a surface of the substrate table, a substrate held by the substrate table, or both the substrate table and the substrate, the liquid handling structure comprising a plurality of elongate liquid extraction openings, the liquid extraction openings being spaced apart and each liquid extraction opening overlapping at least one adjacent liquid extraction opening such that no line extending substantially parallel to the scan direction from a point in the region where the patterned beam is incident on the substrate does not pass underneath at least one of the liquid extraction openings.

According to an aspect of the invention, there is provided a lithographic apparatus comprising:

a substrate table constructed to hold a substrate;

a projection system configured to project a patterned radiation beam onto a target portion of the substrate;

a positioner arranged to effect relative movement between the substrate table and the projection system;

a control system arranged to control the positioner to move the substrate table relative to the projection system in a scan direction during exposure of a target portion of a substrate by projection of the radiation beam thereon; and a liquid handling structure arranged to remove liquid from a surface of the substrate table, a substrate held by the substrate table, or both the substrate table and the substrate, the liquid handling structure comprising a plurality of liquid extraction openings arranged opposite the surface, the arrangement of liquid extraction openings being such that, when the liquid extraction openings are in fluid communication with a source of under pressure, a plurality of low pressure regions are formed between the surface and the liquid handling structure, the low pressure regions being elongate, spaced apart and each overlapping at least one adjacent low pressure region such that no line extending substantially parallel to the scan direction from any point in the region where the patterned beam is incident on the substrate does not pass through at least one of the low pressure regions.

According to an aspect of the invention, there is provided a liquid handling structure configured to remove liquid from a surface of a substrate table, a substrate held by the substrate table, or both the substrate table and the substrate, the liquid handling structure comprising an array of liquid extraction openings arranged along a line, each of the liquid extraction openings being elongate in a respective direction of elongation and the directions of elongation being at an angle of greater than 0 to the line.

According to an aspect of the invention, there is provided a device manufacturing method comprising:

projecting an image of a pattern onto a substrate through a liquid confined to a space adjacent the substrate; and removing liquid from the substrate through an array of liquid extraction openings arranged along a line, each of the liquid extraction openings being elongate in a respective direction of elongation and the directions of elongation being at an angle of greater than 0 to the line.

According to an aspect of the invention, there is provided a device manufacturing method using a lithographic apparatus having a projection system, the method comprising:

projecting an image of a pattern onto a substrate through a liquid confined to a space adjacent the substrate while relatively moving the substrate and the projection system in a scan direction; and removing liquid from a surface of the substrate by connecting a plurality of liquid extraction openings arranged opposite the surface to a source of under pressure so as to form a plurality of low pressure regions between the surface and the liquid extraction openings, the low pressure regions being elongate, spaced apart and each overlapping at least one adjacent low pressure region when viewed in the scan direction.

According to an aspect of the invention, there is provided a lithographic apparatus comprising:

a substrate table constructed to hold a substrate; and a liquid handling structure arranged to remove liquid from a surface of the substrate table, a substrate held by the substrate table, or both the substrate table and the substrate, the liquid handling structure comprising an array of liquid extraction openings in a linear arrangement, each of the liquid extraction openings having an elongate dimension in a direction different from that of the linear arrangement.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid handling structure for use in a lithographic projection apparatus;

FIG. 4 depicts a liquid handling structure for use in a lithographic projection apparatus;

FIG. 8 is a plan view of a plate defining liquid removal openings and other parts of a liquid removal device according an embodiment of the invention;

FIG. 9 is an enlarged view of the circled part of FIG. 8;

DETAILED DESCRIPTION

Figure 1:
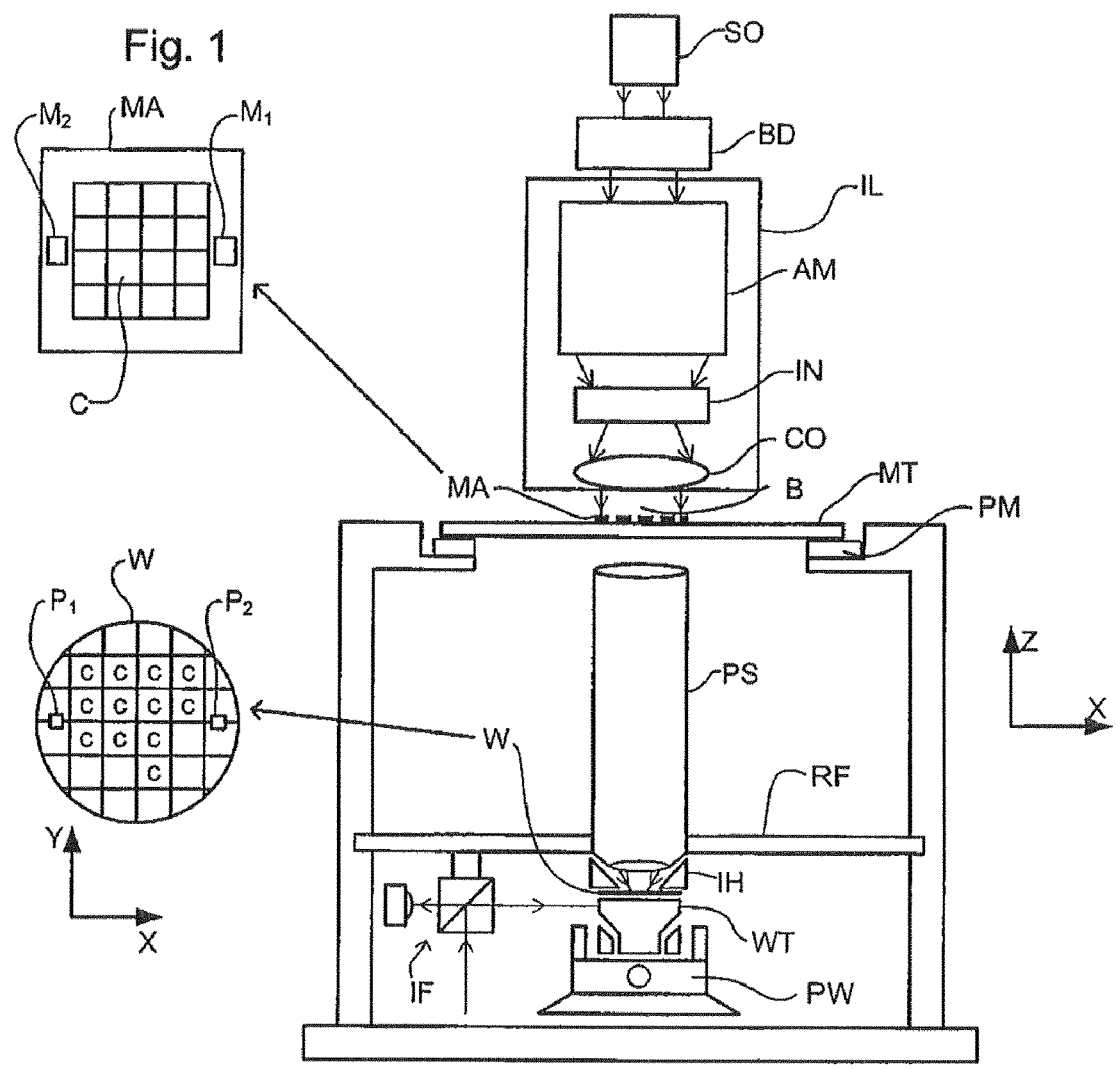
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:
1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed additionally or in the alternative.

Figure 5:
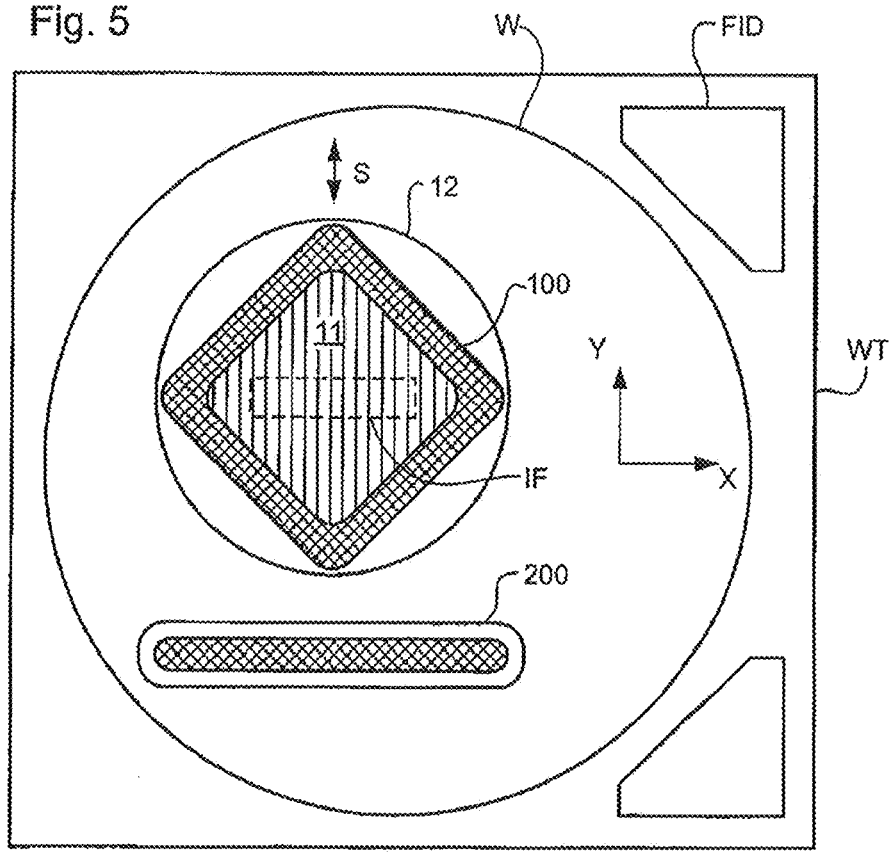
FIG. 5 depicts parts of a substrate stage, a structure configured to handle liquid and control a localized area of immersion liquid on a substrate held on a substrate table, and a liquid removal device to remove liquid from the substrate according to an embodiment of the invention.

FIG. 5 depicts schematically liquid handling arrangements relative to a substrate stage in more detail. In particular, a liquid handling structure 12 is provided to supply and confine an immersion liquid to a space between the final element of the projection system PS (not shown in this figure) and the substrate W and/or substrate table. (Note that reference to the substrate herein includes references to the substrate table in the alternative or in addition, unless stated to the contrary). This arrangement includes a liquid handling structure with a removal device 100 that is described further below. During the course of a series of exposures and measurements carried out on a substrate W, the substrate table WT is moved relative to the projection system PS and liquid handling structure 12 at high speeds and with high accelerations. At various times, e.g. when exposing edge dies and when making measurements using a sensor provided in sensor block FID, the edge of the substrate may pass under the localized body of immersion liquid 11. This, and large accelerations or changes in direction of the substrate table WT, may cause a droplet of liquid to break away from the body of immersion liquid and be left behind on the substrate, substrate table and/or a sensor FID. A droplet left on the substrate may cause a problem, as discussed above, by causing localized cooling and hence distortion of the substrate. A droplet may deposit dissolved or suspended contaminants and/or attract contaminants from the environment. Therefore, the liquid removal system 100 according to an embodiment of the invention is intended to reduce or minimize droplets left on the substrate, for example created, by stabilizing the meniscus of the body of immersion liquid.

One or more additional liquid removal devices 200 according to an embodiment of the invention may be provided to remove any liquid left on the substrate W. The liquid removal device may be fixed in position relative to the projection system so that the normal movement of the substrate table under the projection system during a series of exposures sweeps the substrate under it. The liquid removal device 200 may be provided with its own positioner. The liquid removal device 200 may be used when the liquid handling structure 12 does not have a liquid removal system, e.g. liquid removal device 100, according to an embodiment of the invention. For example, the liquid removal device 100 may be of one of the types of liquid handling structures depicted in FIGS. 2 to 4 and described above or a type which uses a gas knife to confine the immersion liquid, e.g. as disclosed in United States patent application publication no. US 2004-0207824, incorporated herein by reference.

Figure 6:
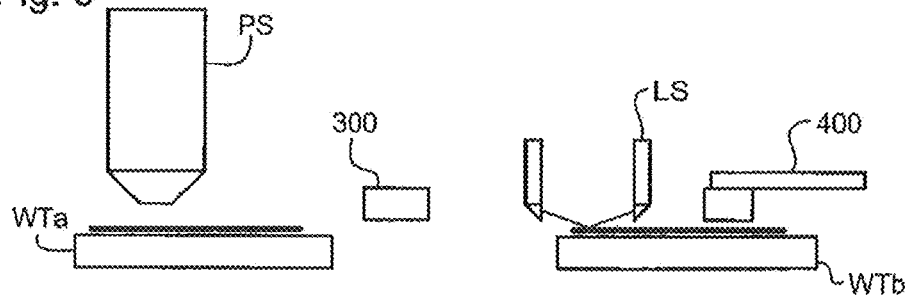
FIG. 6 depicts other arrangements of a substrate stage of a lithographic apparatus and a liquid removal device according an embodiment of the present invention.

A liquid removal device according to an embodiment of the invention may alternatively or in addition be placed at other positions in a lithographic apparatus. For example, as shown in FIG. 6, a liquid removal device 300 may be positioned between an exposure station, at which a substrate is exposed, and a measurement station at which measurements are taken. A measurement taken at the measurement station may be a height map using a level sensor LS. A substrate may be loaded onto and/or off a substrate table at the measurement station. Liquid removal device 300 may be sufficiently large and suitably positioned so that the whole of the substrate is swept as the substrate table passes beneath it when transferring between stations. A liquid removal device 400 may be positioned at the measurement station to dry the substrate in conjunction with the taking of measurements. The liquid removal device 400 may be provided with its own positioning system. The liquid removal device may be located outside a lithographic device, for example in the track. There it would have the same features as any of the liquid removal devices 200, 300, 400 herein described.

Figure 7:
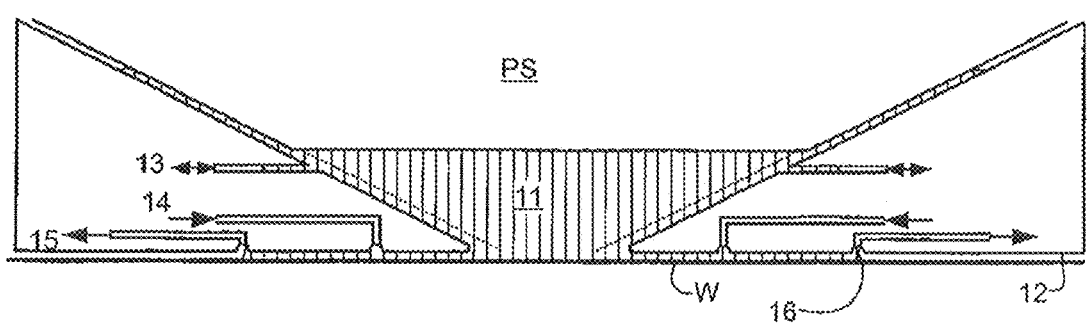
FIG. 7 depicts, in cross-section, a barrier member forming part of the liquid handling structure of FIG. 5.

The liquid handling structure 12 is schematically depicted in FIG. 7. It forms part of a localized immersion system. The liquid handling structure 12 is arranged to control, in particular to supply and to confine, immersion liquid to a space between the final element of the projection system PS and the substrate W. The main part of the liquid handling structure is a barrier member 12, which extends along at least a part of a boundary of the space between the final element of the projection system and the substrate. The barrier member 12 is substantially stationary relative to the projection system in the XY plane though there may be some relative movement in the Z direction (in the direction of the optical axis).

The barrier member 12 is a structure which may at least partly contain liquid in the space 11 between a final element of the projection system PS and the substrate W. Immersion liquid is provided via liquid opening 14, i.e. it is an inlet, and fills the space between the substrate surface and the final element of the projection system. The space is at least partly delimited by the barrier member 12 positioned below, and typically surrounding, the final element of the projection system PS. Liquid may be supplied to or removed from the space via inlet-outlet 13. The barrier member 12 may extend a little above the final element of the projection system. The liquid level may rise above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery may closely conform to the shape of the image field IF, e.g., rectangular, though this need not be the case.

The liquid 11 in the space is prevented from spilling out over the whole of the surface of the substrate by liquid extraction conduit 15, forming part of liquid removal device 100. In an embodiment, liquid extraction conduit 15 is in fluid communication with a plurality of orifices. The orifices form liquid openings which are disposed around the space occupied by the immersion liquid. The shape and arrangement of these orifices serves to control and in particular stabilize the meniscus 16 of the immersion liquid 11 so as to reduce or minimize droplets breaking away from, or bubbles entering, the immersion liquid. In an embodiment, the orifices take the form of elongate slots and form one or more orderly arrangements, i.e. in an array, for example, along a line which may be called an 'imaginary line'. No actual line may be visible in an embodiment of the invention but may be constructed by joining corresponding points on each slot. The slots of an array may be arranged as a linear array, for example in a pattern. The array may be one-dimensional, so that the slots are positioned along the line. The slots are oriented at an angle of greater than 0, e.g. 15°, 30° or 45°, to the imaginary line. Adjacent slots along the array overlap when viewed in the main scanning direction S of the apparatus. This arrangement may be beneficial in stabilizing the meniscus when movements in the main scanning direction are performed.

The main scanning direction of the apparatus is the direction of relative movement of the substrate and projection system during exposures of target portions of the substrate. Commonly, an XYZ coordinate system is used to define positions in the apparatus with the Z axis being the optical axis of the projection system. The main scanning direction may be parallel to the Y axis. The substrate table may also make rapid movements in the direction, e.g. X, substantially perpendicular to the main scanning direction. Therefore in an embodiment of the invention some slots, in the same or different arrays, may be differently oriented and arranged to overlap when viewed in the perpendicular direction. These arrangements may stabilize the meniscus when movements in this substantially perpendicular direction are made.

In an embodiment of the invention, the openings of the liquid removal device are conveniently defined by a plate that covers the lower surface of the barrier member 12 and has appropriately shaped apertures. An example of such a plate 110 is shown in FIGS. 8 and 9, FIG. 9 being an enlargement of the part of FIG. 8 indicated by a dashed circle. In another embodiment, the openings, e.g. inlets and outlets, may be individual needles.

Plate 110 is generally square in plan with its diagonals substantially parallel to the X and Y directions. Four sets of slots 111 define the openings of the liquid removal device. These slots are arranged around the periphery of the plate, one set along each side. The slots of each set form an array, being arranged regularly along respective imaginary lines A-A, B-B C-C and D-D, indicated by dot-chain lines, that are substantially parallel to the respective sides of the plate. The imaginary lines are therefore at an acute angle a1, in this case 45°, to the X axis. The main scanning direction S of the apparatus is parallel to the Y axis. Additional liquid openings 112 are provided in the corners of the plate—these do not form part of any of the arrays. The additional openings 112 have their largest dimension oriented substantially perpendicular to the diagonal on which they lie. A ring of holes 113 forms the liquid inlet by which the space between the final element of the projection system and the substrate is filled with immersion liquid 11. Central aperture 114 matches the central hole of the barrier member 12.

When the plate is on or part of the barrier member 12, the slots 111 communicate with one or more grooves in the barrier member that are in fluid communication with an under pressure, e.g., formed by a vacuum pump. Holes 113 communicate with one or more grooves in fluid communication with a source of the immersion liquid. The slots may all be equidistant from the edge of the plate, and the edge of the barrier member 12 if the plate does not extend to the edge of the barrier member, so that the gas flows are uniform. Any non-uniformity in flow rates into the slots may be corrected by variations in the cross-section of the groove(s) in the barrier member with which the slots communicate.

As can be more clearly seen in FIG. 9, slots 111 are arranged at an angle a2 to the imaginary line (i.e. the principal direction of the array) and overlap when viewed in the main scanning direction S. In an embodiment the angle a2 is 45° so that the slots are perpendicular to the main scanning direction. The amount of overlap o is determined by the angle a2 and the lengths of the slots. The amount of overlap can be set as required for a specific embodiment. The amount of overlap may be greater than 5% of the length of the slots, desirably greater than 10%, and less than 75%, desirably less than 50%. When the apparatus is in operation, the meniscus 16 of the main body of the immersion liquid 11 adopts approximately the position indicated by the dotted line in FIG. 9. This is a zigzag line with segments under the angled slots 111 that are nearly parallel to the slots and segments in between that are more nearly parallel to the scanning direction. It is believed that the meniscus is more stable with the angled slots arrangement because the parts of the meniscus not under the slots are nearly parallel to the scanning direction. These parts of the meniscus are, thus, smoothed rather than disrupted by the gas flows due to the movement of the substrate. Under the slots, where the meniscus is nearly perpendicular to the scanning direction, instability of the meniscus is less of a problem as any liquid that does break away from the meniscus is quickly sucked away through at least one of the slots.

The angle between the slots and the imaginary line may be in the range of from 10 to 80°, desirably from 20 to 70°, more desirably from 30 to 60°, most desirably from 40 to 50°. Each array of slots may comprise comprises N slots, where N is an integer in the range of from 5 to 150, desirably in the range of from 10 to 100, desirably in the range of from 20 to 40. The liquid extraction slots may have a length in the direction of elongation in the range of from 50 μm to 50 mm, desirably 0.1 mm to 10 mm, desirably 1 mm to 5 mm. The liquid extraction slots may have a width perpendicular to the direction of elongation in the range of from 5 μm to 5 mm, desirably 10 μm to 1 mm, desirably 50 μm to 0.1 mm. The slots do not need to have uniform width. The ends of the slots may be rounded. The liquid extraction slots may have an aspect ratio in the range of from 1:2 to 1:100, desirably 1:3 to 1:20, desirably 1:5 to 1:10. The slots of an array may be arranged along the imaginary line in a pattern. The slots may be spaced apart according to a pattern, such as a geometric, arithmetic and/or repeating pattern. In one arrangement the slots of an array are equidistantly spaced apart. The slot spacing may be in the range of from 0.5 mm to 5 mm, desirably 1 mm to 2 mm. In an embodiment the liquid extraction slots are substantially straight. In an embodiment the slots are curved.

In an embodiment the imaginary line is substantially straight. In an embodiment the imaginary line is curved, for example in the form an arc. The slots of an array may be oriented at an angle with respect to the direction of the linear direction of a straight imaginary line or the tangent of the curved imaginary line at the position of the slot along the line. Arrays of slots may be arranged around the optical axis of the projection system. The arrays present in a liquid handling structure may interconnect. The interconnected arrays may form the outline of a shape such as a rectilinear shape (e.g. a rhombus), a circle or an ellipse. Thus, the different arrays (and the corresponding imaginary lines) may connect to form a pattern of slots arranged around the optical axis. The slots may be equidistantly spaced along the imaginary line. The slot spacing may be in the range of from 0.5 mm to 5 mm, desirably 1 mm to 2 mm.

In an embodiment of the invention, the slots may be V-shaped, possibly with alternate V-shapes inverted. In an embodiment of the invention each slot may be replaced by a line or group of small holes of any shape. Such small holes are arranged so as to generate, in use, an under pressure of the same shape as the slots.

Figure 10:
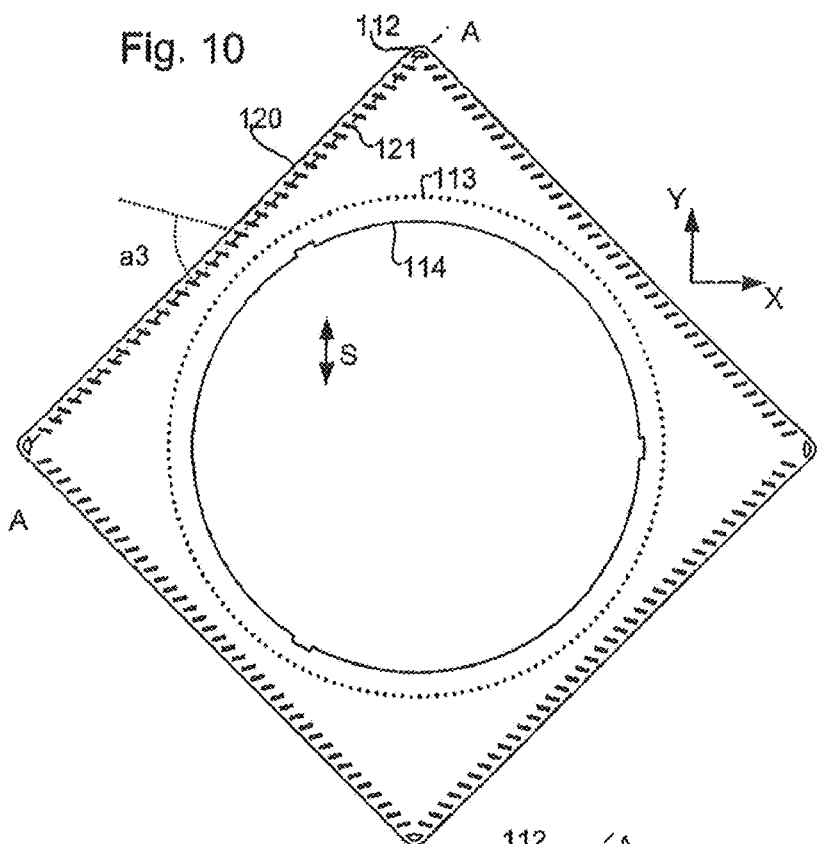
FIG. 10 is a plan view of another plate forming part of a liquid removal device according to an embodiment of the present invention.

Another plate 120 which may be used in an embodiment of the invention is shown in FIG. 10. This plate is the same as the plate 110 except in the angle of the slots 121. In this embodiment, the angle a3 between the slots 121 and the imaginary line on which they are arrayed is 60°. So the slots 121 are at an angle of 75° to the main scanning direction S.

Figure 11:
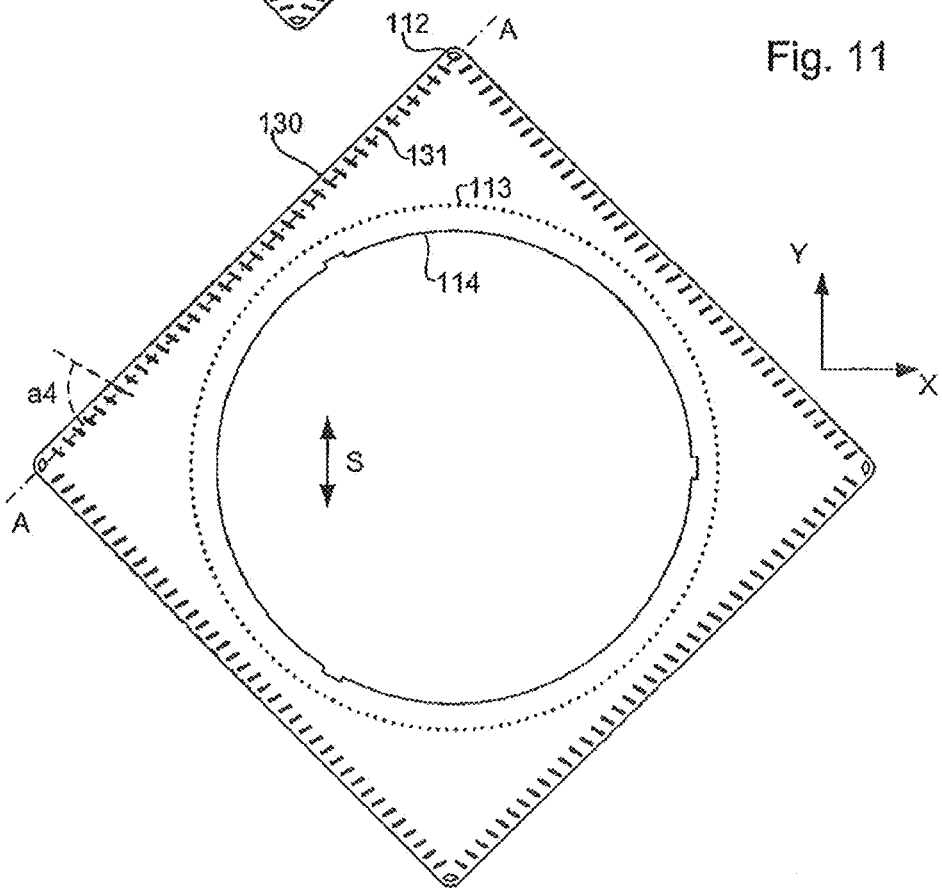
FIG. 11 is a plan view of a further plate forming part of a liquid removal device according to an embodiment of the invention.

A further plate 130 is shown in FIG. 11. The plate 130 is the same as plate 110 except that the angle a4 between the slots 131 and the imaginary line is 75°. So the angle between the slots 131 and the main scanning direction is 60°.

Figure 12:
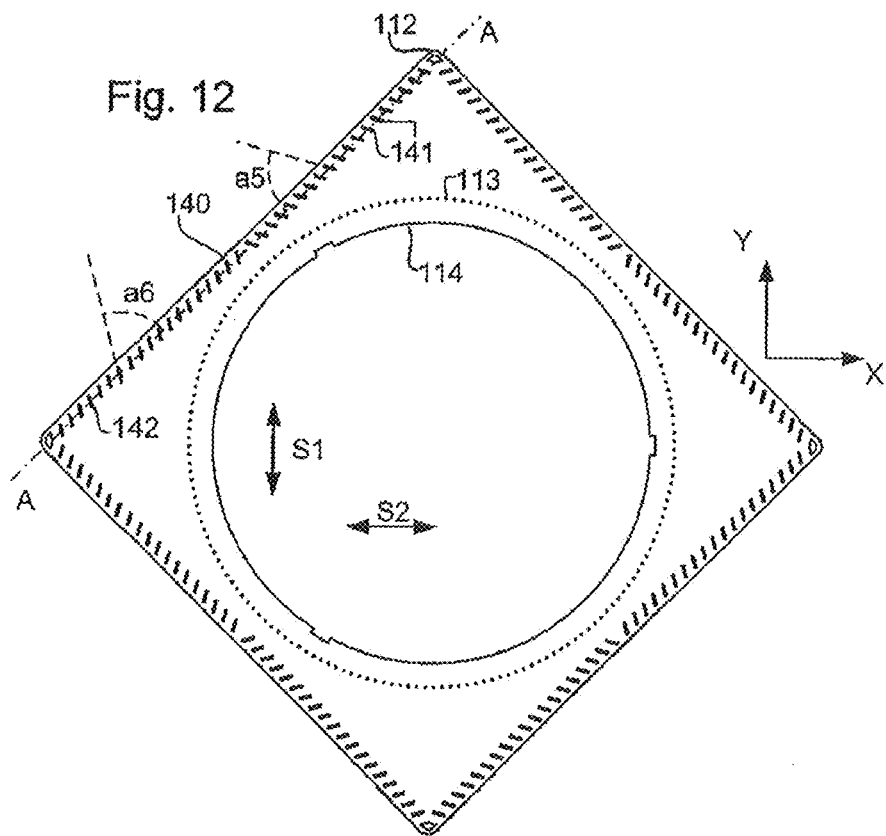
FIG. 12 is a plan view of another plate forming part of a liquid removal device according to an embodiment of the present invention.
Figure 13:
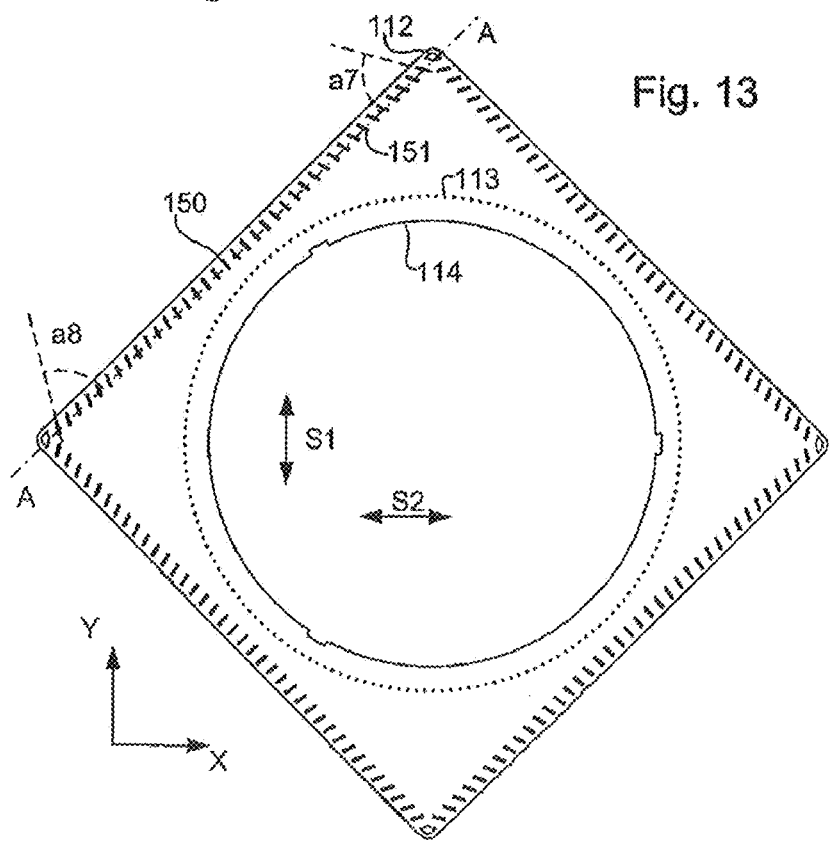
FIG. 13 is a plan view of another plate forming part of a liquid removal device according to an embodiment of the invention.

As mentioned above, it is desirable that the meniscus of the main body of immersion liquid remains stable when the substrate table makes movements in the direction substantially perpendicular to the main scanning direction. This direction may be referred to as the subscanning direction, or the stepping direction, as it steps between scans. Movements in this direction are made, for example, to reposition the substrate for a new exposure. Plates that are adapted to achieve this desideratum are shown in FIGS. 12 and 13. The plates are substantially the same as plate 110 except in relation to the disposition of the slots.

In plate 140 shown in FIG. 12, the slots arranged along each side are divided into two subsets. The slots 141 of one subset are arranged at an angle a5 of 60° to the imaginary line so that they make an angle of 75° to the main scanning direction S1. The slots 142 of the other subset are likewise arranged at an angle a6 of 60° to the imaginary line but in the other direction. The slots 142 make an angle of 75° to the subscanning direction S2. The arrays of slots 141 are located so that they are on either side of the leading and trailing points of the plate when the substrate is moving in the main scanning direction. The arrays of slots 142 are on either side of the leading and trailing points when the substrate is moving in the subscanning direction.

Plate 150, shown in FIG. 13, has slots 151 that are not all oriented in the same direction. The slots closest the leading and trailing points in the main scanning direction are arranged, at one extreme of the embodiment, at an angle a7 of 60° to the imaginary line so that they make an angle of 75° to the main scanning direction S1. The slots closest to the leading and trailing points in the subscanning direction are likewise arranged, at another extreme of the embodiment, at an angle a6 of 60° to the imaginary line but in the other direction. These slots make an angle of 75° to the subscanning direction S2. In an embodiment, the slots in between are at angles that progressively vary from one extreme to the other. In an embodiment, there may be groups of slots, either at the ends or the middle of the array, that have the same orientation. In an embodiment, there may be groups of slots whose orientations vary progressively. As illustrated the variation in angle is linear though this need not be the case.

Figure 14:
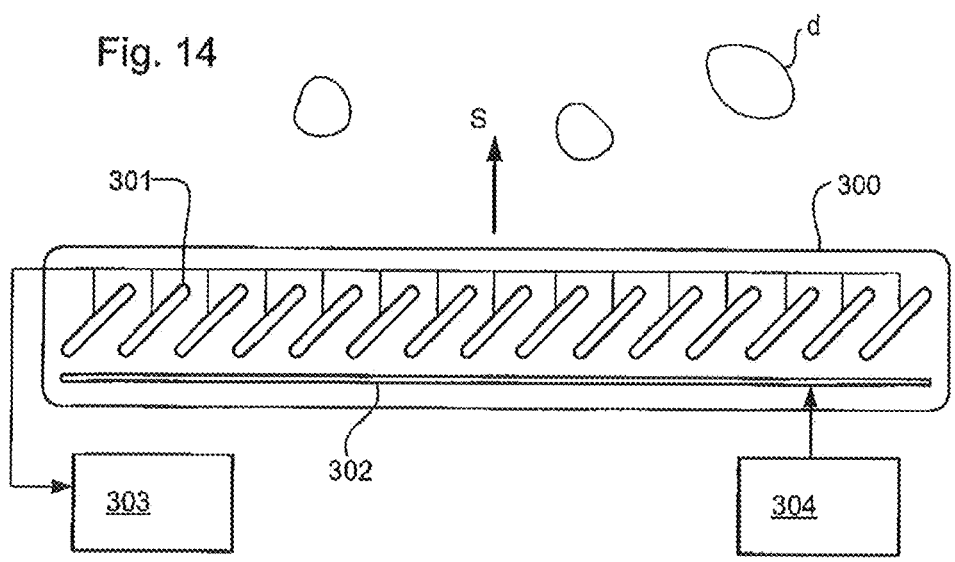
FIG. 14 depicts a liquid removal device operating to remove droplets according to an embodiment of the present invention.

A liquid removal device 300 according to an embodiment of the invention that is used to remove liquid, e.g. droplets d, from a surface is shown in FIG. 14. An array of slots 301 is disposed along a line substantially perpendicular to the direction of relative movement between the surface to be dried and the liquid removal device. This is equivalent to the line, i.e. the imaginary line, mentioned in reference to the slots for the liquid handling structure 12. In an embodiment, the slots are at an angle of 45° to the line but this, and the lengths of the slots, may be varied in accordance with the expected amount of liquid d to be removed and the relative speed of the surface and liquid removal device. The dimensions and orientations of the slots in this embodiment, as well as the arrangement of the array of slots, for example along an imaginary line, may be the same as described above for the slots in the liquid handing structure 12 with reference to FIGS. 8 to 13. The slots 301 are connected to a source of under pressure 303, e.g. a vacuum pump. A gas knife formed by a long slot 302 connected to a gas supply 304 may be provided behind the extraction slots 301 to sweep up any liquid not extracted via slots 301 and to hold it in a position where it can be extracted. This gas knife may direct a gas flow onto the surface perpendicularly or at an angle. In an embodiment the gas flow from the gas knife may flow onto the surface at an angle in the range of 0 to 90 degrees, towards the slots 301.

In use, the liquid removal device moves in direction S relative to the substrate (and/or the substrate moves in the opposite direction to direction S relative to the liquid removal device). A liquid droplet present on the substrate encounters the under pressure from the slots 301. The liquid later encounters the gas flow from the gas knife 302. If the under pressure from a slot is insufficient to remove liquid, the gas knife 302 will hinder movement of the liquid, increasing the time for the liquid to be extracted through a slot. The elongate shape of a slot increases the time of exposure of the liquid to the under pressure relative to a point source of under pressure, for example, through a circular hole. Interaction of the under pressure from adjacent slots may occur. As the slots are angled with respect to the movement direction, for example in the scanning direction, and sufficiently close, the under pressure flows may interact. The under pressure flows may interact with the meniscus of liquid providing forces to the liquid to extract the liquid. Where a droplet bridges two slots (e.g., when extracting a film), the liquid meniscus is not straight, but curved in a direction perpendicular to the movement direction. Along slots, the meniscus tends to align with the slot. Between slots, the meniscus tends to align with the movement direction. This allows the liquid to be readily extracted through the slots. As the slots are desirably overlapped with respect to the movement direction, the under pressures may strongly interact. A stable meniscus may form between the slots as shown by the dotted line in FIG. 15, directing the liquid into the extracting slots. Effective extraction of the liquid using the liquid removal device may be achieved.

Figure 16:
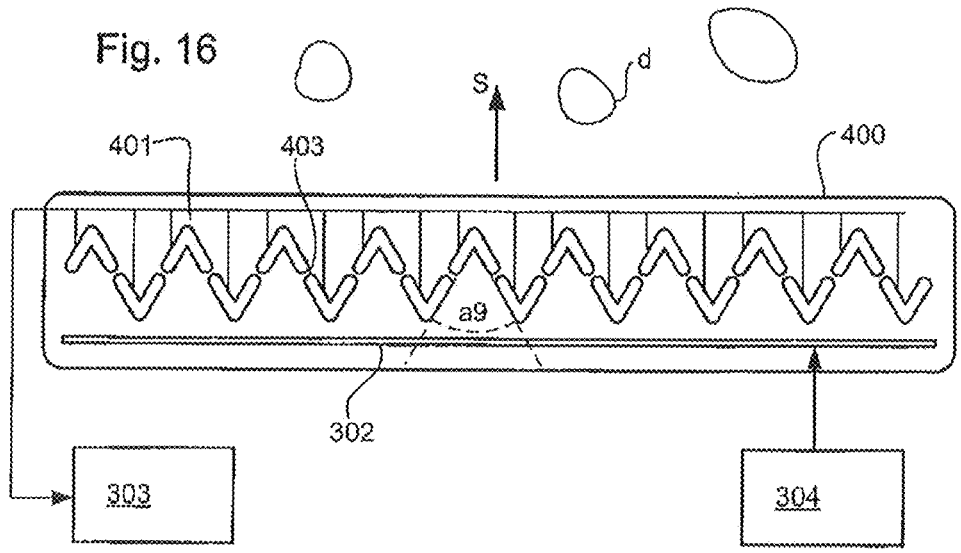
FIG. 16 depicts a liquid removal device according to an embodiment of the present invention.

Another liquid removal device 400 according to an embodiment of the invention is shown in FIG. 16. This liquid removal device is the same as liquid removal device 300 described above, except as described below. Liquid removal device 400 has an array of V-shaped openings, e.g., slots, 401, alternate ones of which are oriented in opposite directions and located on opposite sides of an imaginary line. The slots 401 therefore form a zigzag line interrupted in the middle of each branch by a small "bridge" 403. Some or all of the bridges 403 may be omitted so that the liquid removal opening is in the form of short or long zigzagged lines. In the illustrated embodiment, the included angle a9 in each of the V-shapes is 60° but other angles, e.g. in the range of from 15° to 75° may be used. The included angles of the V-shaped slots may vary. The size and number of the V-shaped slots 401 may be chosen according to the specific embodiment. There may be N v-shaped slots, where N is an integer in the range of from 5 to 150, desirably in the range of from 10 to 100, desirably in the range of from 20 to 40. The V-shaped slots may have arms having a length in the range of from 50 μm to 50 mm, desirably 0.1 mm to 10 mm, desirably 1 mm to 5 mm. The arms of the V-shaped slots may have a width in the range of from 5 μm to 5 mm, desirably 10 μm to 1 mm, desirably 50 μm to 0.1 mm. The slots do not need to have uniform width. The ends of the slots may be rounded.

An array of V-shaped slots as described above with reference to FIG. 16 may also be used in a liquid removal device 11 as described above with reference to FIG. 5.

Figure 17:
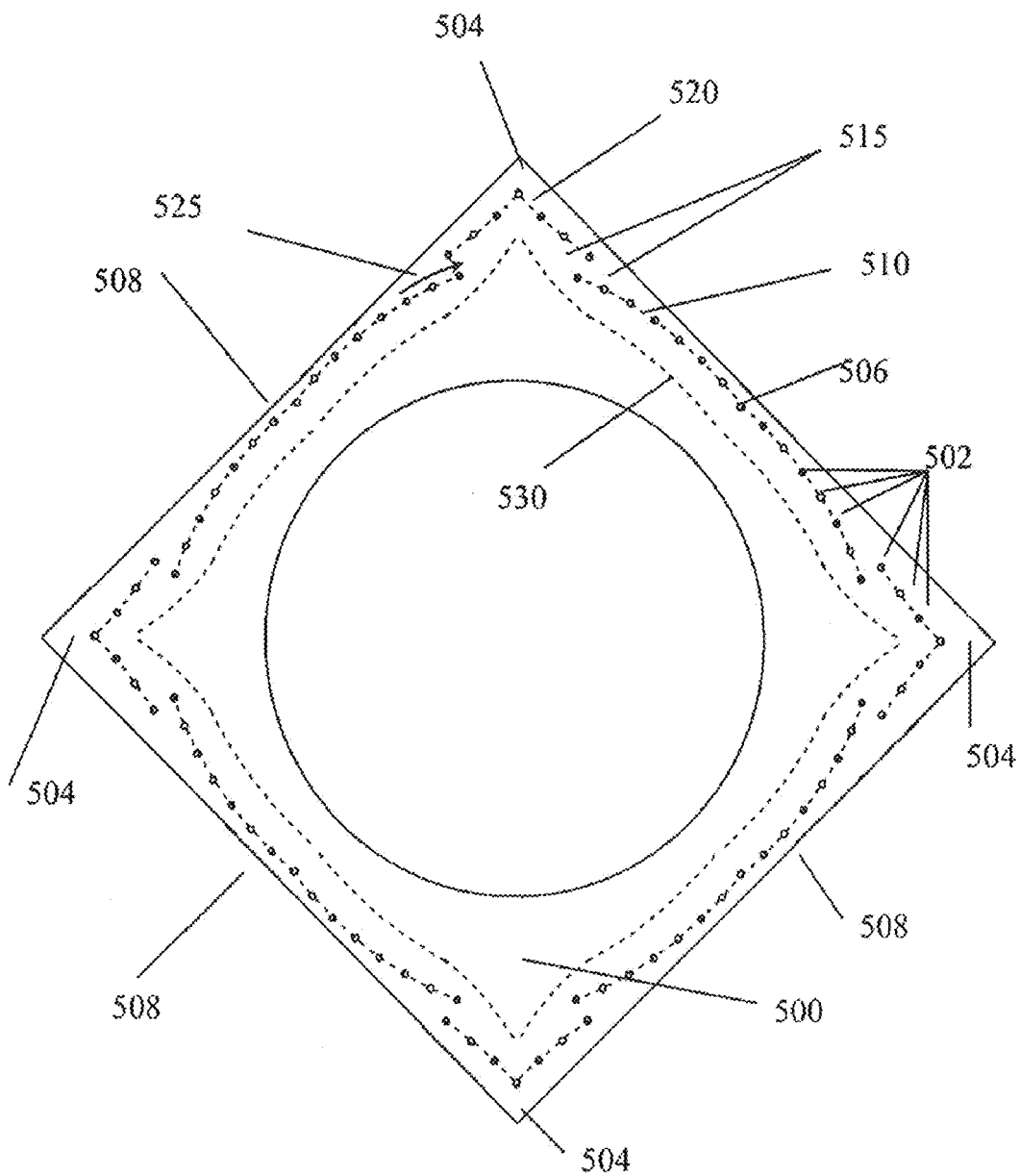
FIG. 17 is a plan view of a plate defining liquid removal openings and other parts of a liquid removal device according an embodiment of the invention.

FIG. 17 shows a liquid removal device 500 according to an embodiment of the invention. The liquid removal device 500 has the same features as the liquid removal device 100 described earlier, unless mentioned herein. The liquid removal device 500 has slots in its undersurface which are each in the form of an array 510, 520, for example a linear array, of small openings 502. Each array 510, 520 of small openings is arranged so as to generate, in operation, an under pressure of the substantially same shape as would be generated by a slot.

In the embodiment shown in FIG. 17, between each corner 504 of the liquid removal device 500 there are three linear arrays 510, 520. Between a corner 504 and an intermediate point 506 between two neighboring corners, e.g. a midpoint of a side 508 of the liquid removal device 500 interconnecting the corner 504 with another corner, there are two linear arrays 510, 520. The two linear arrays are generally aligned with the side. One array, an edge array 510, is located further from the corner having the other array, a corner array 520. The neighboring ends of the two arrays 510, 520 overlap each other with respect to the side 506. The arrays 510, 520 overlap in a region of overlap 515. So in a direction of movement, such as aligned with an axis passing through two opposite corners e.g. in a scanning or stepping direction, the linear arrays 510, 520 overlap. The overlap may be achieved by the edge array 510 having a radius of curvature larger than that of the corner array 520 in region of overlap 515, for example with respect to the side 508. In the overlapping region 515, immersion liquid which escapes from the edge array 510 may be removed through the corner array 520, if it is not removed by the edge array 510. Immersion liquid may be effectively extracted through the region of overlap 515 as indicated by arrow 525. The overlapping region of the two arrays may function as two neighboring slots as described herein, to extend the duration of time which immersion liquid is exposed to an extracting underpressure.

The embodiment shown in FIG. 17 is arranged so that the overlapping region 515 on each side 508 of a corner 504 is close to the corner. The quantity of liquid which would have accumulated at a trailing corner of the liquid removal device 500 is reduced or substantially no longer accumulates.

In an embodiment, each corner may have an overlapping region 515 present in its neighboring sides. Two corner arrays 520, may meet in the region of a corner 504. Two edge arrays 510 may meet at or near the intermediate point 506 of a side 508. The two edge arrays may form one continuous array. This embodiment, as shown in FIG. 17, has one overlapping region 515 (corresponding to two overlapping slots) associated with each side 508 meeting at a corner 504. There are eight overlapping regions in total. This embodiment has a minimum number of overlapping regions for a four sided shape in which each corner 504 has an overlapping region associated with each of the sides which meet to from the corner 504. So as there are two corners associated with each side, there are overlapping regions in each side, each overlapping region may be associated with a different corner. In an embodiment there are at least two overlapping regions in a side that are associated with the same corner 508. Having an overlapping region associated with each side meeting at a corner, for example a trailing corner, is desirable because it enables an increase of the critical relative velocity, for example the scan velocity, between a substrate and the liquid removal device 500. The throughput of the immersion lithographic apparatus can increase.

As shown in FIG. 17, the shape 530 formed by openings 113 for the supply of liquid may have a non-circular geometry, such as a rectilinear e.g. a rhombic or even a square shape. The shape may have any shape, such as that described in U.S. Patent Application No. 61/129,717, filed Jul. 14, 2008, which is hereby incorporated in its entirety by reference. The shape 530 is intended to follow the shape of the openings 502. The shortest distance between a position on the edge of the shape 530 and a position on the linear arrays 510, 520 is substantially consistent and uniform, except in the region of overlap 515. In the region of overlap 515, the relative displacement of openings in each of the two arrays 510, 520 is considered.

Figure 15:
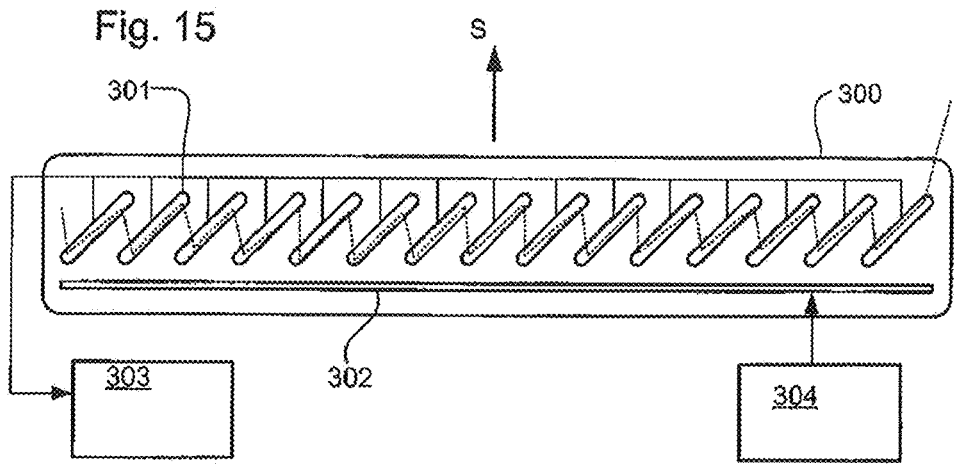
FIG. 15 depicts the liquid removal device of FIG. 14 operating to remove a film.

The embodiment described with respect to FIG. 17 may be applied to a liquid removal device as described with respect to FIGS. 14 to 16.

In a localized immersion system, liquid is only provided to a localized area of the substrate. The space 11 filled by liquid, i.e. the reservoir, is smaller in plan than the top surface of the substrate. The reservoir remains substantially stationary relative to the projection system PS while the substrate W moves underneath it. Another category of immersion system is the bath type arrangement in which the whole of the substrate W and optionally part of the substrate table WT is submersed in a bath of liquid. A further category is the all wet solution in which the liquid is unconfined. In this arrangement substantially the whole top surface of the substrate and optionally all or part of the substrate table is covered in a thin film of immersion liquid. Any of the liquid supply devices of FIGS. 2 to 5 can be used in such a system; however, their sealing features are not present, are not activated, are not as efficient as normal or are otherwise ineffective to seal liquid to only the localized area.

Other arrangements are possible and, as will be clear from the description below, an embodiment of the present invention may be implemented in any type of localized liquid supply system as the liquid supply system.

As discussed above, an immersion system using an immersion liquid may leave droplets of the immersion liquid, e.g. water, on the substrate after or during exposures. The droplets may cause one or more problems. Evaporation of a droplet may cause localized cooling and therefore thermal distortion of the substrate. Particles and other contaminants may be attracted to and collect in a droplet. A droplet that evaporates may leave behind a drying ring and contaminating particles. A droplet may interact with resist on the substrate and may cause pattern defects. When a droplet is left behind by a localized immersion system it may subsequently be swept up by it and collide with a meniscus of liquid in the reservoir 11, for example after a change in direction of relative motion between the substrate table WT and the immersion system. A bubble may then be generated in the liquid under the projection system. Vapor from an evaporated droplet may affect a sensor such as an interferometric position sensor. Therefore, an embodiment of the present invention provides an improved device to control the meniscus of the immersion liquid. Another embodiment of the present invention provides a liquid removal device (or a liquid remover) that is more effective at removing a droplet from the substrate surface. Embodiments of the present invention may reduce evaporation of a droplet from the substrate by preventing the separation of a droplet from the main body of immersion liquid, by more efficient removal of a droplet from the substrate surface, or a combination of both approaches.

An embodiment of the invention may be applied to the surface of the substrate table and a surface of a component located in the surface of the substrate table WT, for example, a shutter member (e.g. a closing disk or portion of the substrate table), and/or a sensor. A droplet of immersion liquid may be present on one or more of these surfaces. A droplet may be removed from a surface of the substrate table using an embodiment of the invention. For this reason, a reference to the surface of the substrate W also refers to the surface of the substrate table WT and surfaces of components located in the substrate table, unless expressly stated to the contrary.

The liquid removal device may be used in a fluid remover or dryer, such as a drying station (not shown). The dryer may be part of a bath type or all wet immersion system, as described above, where immersion liquid is not confined to a portion of the substrate, but may flow over the surface of the substrate. In the dryer, the droplet remover removes liquid present on the surface of a substrate. The drying may occur after exposure of the substrate is complete and before the substrate leaves the lithographic apparatus for processing elsewhere in the track, for example, for development, coating, baking and etching. The drying may occur after measurement in a metrology system where immersion liquid is used to replicate an immersion environment.

The liquid removal device may be the operative part of a dryer. To operate the dryer, the dryer may pass over a substrate that has been removed from the immersion system. In another embodiment, the dryer may pass over the substrate once immersion liquid has been drained from the immersion system and/or the liquid supply to the immersion system has stopped. The liquid covering the substrate may break from a film to form many droplets. As the dryer, e.g. a droplet extractor, passes over the substrate surface, liquid present on the substrate is removed by the dryer, drying the surface.

In an embodiment, there is provided a lithographic apparatus comprising: a substrate table, and a liquid handling structure. The substrate table is constructed to hold a substrate. The liquid handling structure is arranged to remove liquid from a surface of the substrate table, a substrate held by the substrate table, or both the substrate table and the substrate. The liquid handling structure comprises an array of liquid extraction openings arranged along a line. Each of the liquid extraction openings is elongate in a respective direction of elongation. The directions of elongation being at an angle of greater than 0 to the line.

The liquid handling structure may comprise a second array of liquid extraction openings arranged along a second line. Each of the liquid extraction openings of the second array may be elongate in a respective direction of elongation. The directions of elongation of the liquid extraction openings of the second array may be at an angle of greater than 0 to the second line. The liquid handling structure may comprise third and fourth arrays of liquid extraction openings arranged along respective third and fourth lines. Each of the liquid extraction openings of the third and fourth arrays may be elongate in a respective direction of elongation. The directions of elongation of the liquid extraction openings of the third and fourth arrays may be at an angle of greater than 0 to the respective third and fourth lines. The first, second, third and fourth arrays may be positioned so as to substantially surround a space below a final element of a projection system. The projection system may be configured to project a patterned radiation beam onto a target portion of the substrate. The line may be substantially straight.

The apparatus may comprise a projection system configured to project a patterned radiation beam onto a target portion of the substrate. The line along which the array of slots is arranged may form a substantially closed loop around an optical axis of the projection system. The angle of greater than 0 may be in the range of 10 to 80°, in the range of 20 to 70°, in the range of 30 to 60°, or in the range of 40 to 50°. The liquid extraction openings may be substantially mutually parallel. The angles between the directions of elongation of the liquid extraction openings and the line may vary progressively along the array.

A first subset of the liquid extraction openings may have directions of elongation making a first angle of greater than 0 to the line and a second subset of the liquid extraction openings has directions of elongation making a second angle of greater than 0 to the line, the second angle of greater than 0 being different from the first angle of greater than 0. The array of liquid extraction openings comprises N liquid extraction slots, where N is an integer in the range of 5 to 150, in the range of 10 to 100, or in the range of 20 to 40.

The liquid extraction openings may have a length in the directions of elongation in the range of 50 µm to 50 mm, in the range of 0.1 mm to 10 mm, or in the range of 1 mm to 5 mm. The liquid extraction openings may have a width substantially perpendicular to the directions of elongation in the range of 5 µm to 5 mm, in the range of 10 µm to 1 mm, or in the range of 50 µm to 0.1 mm. The liquid extraction openings may have an aspect ratio in the range of 1:2 to 1:100, in the range of 1:3 to 1:20, or in the range of 1:5 to 1:10.

The liquid extraction openings may be substantially straight. The liquid extraction openings may be substantially equidistantly spaced along the line.

The apparatus may comprise a positioner and a control system. The positioner may be arranged to effect relative movement between the substrate table and a projection system. The control system may be arranged to control the positioner to move the substrate table relative to the projection system in a scan direction during exposure of a target portion of a substrate by projection of the radiation beam thereon. The liquid extraction openings may be arranged so that they overlap when viewed in the scan direction from a point at which an optical axis of the projection system intercepts the substrate. The liquid extraction openings may be defined by a plurality of slots in a plate.

In an embodiment, there is provided a lithographic apparatus comprising: a substrate table, a projection system, a positioner, a control system and a liquid handling structure. The substrate table is constructed to hold a substrate. The projection system is configured to project a patterned radiation beam onto a target portion of the substrate, the projection system having an optical axis. The positioner is arranged to effect relative movement between the substrate table and the projection system. The control system is arranged to control the positioner to move the substrate table relative to the projection system in a scan direction during exposure of a target portion of a substrate by projection of the radiation beam thereon. The liquid handling structure is arranged to remove liquid from a surface of the substrate table, a substrate held by the substrate table, or both the substrate table and the substrate. The liquid handling structure comprises a plurality of elongate liquid extraction openings. The liquid extraction openings are spaced apart, each liquid extraction opening overlapping at least one adjacent liquid extraction opening such that a line extending substantially parallel to the scan direction from a point in the region where the patterned beam is incident on the substrate passes underneath at least two of the liquid extraction openings.

In an embodiment, there is provided a lithographic apparatus comprising: a substrate table, a positioner, a control system and a liquid handling structure. The substrate table is constructed to hold a substrate. The projection system is configured to project a patterned radiation beam onto a target portion of the substrate. The positioner is arranged to effect relative movement between the substrate table and the projection system. The control system is arranged to control the positioner to move the substrate table relative to the projection system in a scan direction during exposure of a target portion of a substrate by projection of the radiation beam thereon. The liquid handling structure is arranged to remove liquid from a surface of the substrate table, a substrate held by the substrate table, or both the substrate table and the substrate. The liquid handling structure comprises a plurality of liquid extraction openings arranged opposite the surface, the arrangement of liquid extraction openings being such that, when the liquid extraction openings are in fluid communication with a source of under pressure, a plurality of low pressure regions are formed between the surface and the liquid handling structure. The low pressure regions are elongate, spaced apart and each overlap at least one adjacent low pressure region such that a line extending substantially parallel to the scan direction from a point in the region where the patterned beam is incident on the substrate passes through at least two of the low pressure regions. Each liquid extraction opening of the plurality of liquid extraction openings may be elongate.

In an embodiment, there is provided a lithographic apparatus comprising: substrate table, a projection system, a positioner, a control system and a liquid handling structure. The substrate table is constructed to hold a substrate. The projection system is configured to project a patterned radiation beam onto a target portion of the substrate. The projection system has an optical axis. The positioner is arranged to effect relative movement between the substrate table and the projection system. The control system is arranged to control the positioner to move the substrate table relative to the projection system in a scan direction during exposure of a target portion of a substrate by projection of the radiation beam thereon. The liquid handling structure is arranged to remove liquid from a surface of the substrate table, a substrate held by the substrate table, or both the substrate table and the substrate. The liquid handling structure comprises a plurality of elongate liquid extraction openings. The liquid extraction openings are spaced apart and each liquid extraction opening overlaps at least one adjacent liquid extraction opening such that no line extending substantially parallel to the scan direction from a point in the region where the patterned beam is incident on the substrate does not pass underneath at least one of the liquid extraction openings.

In an embodiment, there is provided a lithographic apparatus comprising: a substrate table, a projection system, a positioner, a control system and a liquid handling structure. The substrate table may be constructed to hold a substrate. The projection system may be configured to project a patterned radiation beam onto a target portion of the substrate. The positioner may be arranged to effect relative movement between the substrate table and the projection system. The control system may be arranged to control the positioner to move the substrate table relative to the projection system in a scan direction during exposure of a target portion of a substrate by projection of the radiation beam thereon. The liquid handling structure may be arranged to remove liquid from a surface of the substrate table, a substrate held by the substrate table, or both the substrate table and the substrate. The liquid handling structure may comprise a plurality of liquid extraction openings arranged opposite the surface, the arrangement of liquid extraction openings being such that, when the liquid extraction openings are in fluid communication with a source of under pressure, a plurality of low pressure regions are formed between the surface and the liquid handling structure, the low pressure regions being elongate, spaced apart and each overlapping at least one adjacent low pressure region such that no line extending substantially parallel to the scan direction from any point in the region where the patterned beam is incident on the substrate does not pass through at least one of the low pressure regions. Each liquid extraction opening of the plurality of liquid extraction openings may be elongate.

In an embodiment, there is provided a liquid handling structure configured to remove liquid from a surface of a substrate table, a substrate held by the substrate table, or both the substrate table and the substrate. The liquid handling structure may comprise an array of liquid extraction openings arranged along a line. Each of the liquid extraction openings may be elongate in a respective direction of elongation. The directions of elongation may be at an angle of greater than 0 to the line.

In a embodiment, there is provided a drying device comprising the liquid handling structure as herein described.

The drying device may comprise a positioner arranged to effect relative movement between the liquid handling structure and the substrate table in a first direction. The line may be substantially parallel to the first direction.

In an embodiment, there is provided an immersion metrology device including a liquid handling structure as herein described.

In an embodiment, there is provided a device manufacturing method comprising: projecting an image of a pattern onto a substrate through a liquid confined to a space adjacent the substrate; and removing liquid from the substrate through an array of liquid extraction openings arranged along a line, each of the liquid extraction openings being elongate in a respective direction of elongation and the directions of elongation being at an angle of greater than 0 to the line. The projecting and removing may be carried out simultaneously. The removing may be carried out after the projecting has been carried out.

In an embodiment, there is provided a device manufacturing method using a lithographic apparatus having a projection system, the method comprising: projecting an image of a pattern onto a substrate through a liquid confined to a space adjacent the substrate while relatively moving the substrate and the projection system in a scan direction; and removing liquid from a surface of the substrate by connecting a plurality of liquid extraction openings arranged opposite the surface to a source of under pressure so as to form a plurality of low pressure regions between the surface and the liquid extraction openings, the low pressure regions being elongate, spaced apart and each overlapping at least one adjacent low pressure region when viewed in the scan direction. Each liquid extraction opening of the plurality of liquid extraction openings may be elongate.

In an embodiment, there is provided a lithographic apparatus comprising: a substrate table and a liquid handling structure. The substrate table may be constructed to hold a substrate. The liquid handling structure may be arranged to remove liquid from a surface of the substrate table, a substrate held by the substrate table, or both the substrate table and the substrate. The liquid handling structure may comprise an array of liquid extraction openings in a linear arrangement, each of the liquid extraction openings having an elongate dimension in a direction different from that of the linear arrangement. The respective liquid extraction openings may have a position along the linear arrangement and the directions of the elongate dimension and the linear arrangement differ between different positions. The linear arrangement may be curved.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid outlets, one or more gas outlets, one or more fluid outlets for two phase flow, one or more gas inlets, and/or one or more liquid inlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

It should be noted that the term "gas knife" should not be taken as requiring that a specific gas is necessarily used, any gas or mixture of gases may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a substrate table constructed to hold a substrate; and
   a liquid handling structure arranged to remove liquid from a surface of the substrate table, a substrate held by the substrate table, or both the substrate table and the substrate, the liquid handling structure comprising an array of liquid extraction openings arranged along a line, each of the liquid extraction openings being elongate in a respective direction of elongation and the directions of elongation being at an angle of greater than 0 to the line.

2. The apparatus according to claim 1, wherein the liquid handling structure comprises a second array of liquid extraction openings arranged along a second line, each of the liquid extraction openings of the second array being elongate in a respective direction of elongation and the directions of elongation of the liquid extraction openings of the second array being at an angle of greater than 0 to the second line.

3. The apparatus according to claim 2, wherein the liquid handling structure comprises third and fourth arrays of liquid extraction openings arranged along respective third and fourth lines, each of the liquid extraction openings of the third and fourth arrays being elongate in a respective direction of elongation and the directions of elongation of the liquid extraction openings of the third and fourth arrays being at an angle of greater than 0 to the respective third and fourth lines.

4. The apparatus according to claim 3, wherein the first, second, third and fourth arrays are positioned so as to substantially surround a space below a final element of a projection system, the projection system being configured to project a patterned radiation beam onto a target portion of the substrate.

5. The apparatus according to claim 1, wherein the line is substantially straight.

6. The apparatus according to claim 1, further comprising a projection system configured to project a patterned radiation beam onto a target portion of the substrate, wherein the line along which the array of liquid extraction openings is arranged forms a substantially closed loop around an optical axis of the projection system.

7. The apparatus according to claim 1, wherein the angle of greater than 0 is in the range of 10 to 80°.

8. The apparatus according to claim 1, wherein the angles between the directions of elongation of the liquid extraction openings and the line vary progressively along the array.

9. The apparatus according to claim 1, wherein a first subset of the liquid extraction openings has directions of elongation making a first angle of greater than 0 to the line and a second subset of the liquid extraction openings has directions of elongation making a second angle of greater than 0 to the line, the second angle of greater than 0 being different from the first angle of greater than 0.

10. The apparatus according to claim 1, wherein the array of liquid extraction openings comprises N liquid extraction openings, where N is an integer in the range of 5 to 150.

11. The apparatus according to claim 1, wherein the liquid extraction openings have a length in the directions of elongation in the range of 50 μm to 50 mm.

12. The apparatus according to claim 1, wherein the liquid extraction openings have a width substantially perpendicular to the directions of elongation in the range of 5 μm to 5 mm.

13. The apparatus according to claim 1, wherein the liquid extraction openings have an aspect ratio in the range of 1:2 to 1:100.

14. The apparatus according to claim 1, further comprising:
a positioner arranged to effect relative movement between the substrate table and a projection system; and
a control system arranged to control the positioner to move the substrate table relative to the projection system in a scan direction during exposure of a target portion of a substrate by projection of a radiation beam thereon,
wherein the liquid extraction openings are arranged so that they overlap when viewed in the scan direction from a point at which an optical axis of the projection system intercepts the substrate.

15. A liquid handling structure configured to remove liquid from a surface of a substrate table, a substrate held by the substrate table, or both the substrate table and the substrate, the liquid handling structure comprising an array of liquid extraction openings arranged along a line, each of the liquid extraction openings being elongate in a respective direction of elongation and the directions of elongation being at an angle of greater than 0 to the line.

16. A drying device comprising the liquid handling structure of claim 15.

17. An immersion metrology device including a liquid handling structure according to claim 15.

18. A device manufacturing method comprising:
projecting an image of a pattern onto a substrate through a liquid confined to a space adjacent the substrate; and
removing liquid from the substrate through an array of liquid extraction openings arranged along a line, each of the liquid extraction openings being elongate in a respective direction of elongation and the directions of elongation being at an angle of greater than 0 to the line.

19. A device manufacturing method using a lithographic apparatus having a projection system, the method comprising:
projecting an image of a pattern onto a substrate through a liquid confined to a space adjacent the substrate while relatively moving the substrate and the projection system in a scan direction; and
removing liquid from a surface of the substrate by connecting a plurality of liquid extraction openings arranged along a line and opposite the surface, to a source of under pressure so as to form a plurality of low pressure regions between the surface and the liquid extraction openings, the low pressure regions being elongate, spaced apart and each partially overlapping at least one adjacent low pressure region when viewed in the scan direction and wherein each of the liquid extraction openings is elongate in a respective direction of elongation and the directions of elongation are at an angle of greater than 0 to the line.

20. A lithographic apparatus comprising:
a substrate table constructed to hold a substrate; and
a liquid handling structure arranged to remove liquid from a surface of the substrate table, a substrate held by the substrate table, or both the substrate table and the substrate, the liquid handling structure comprising an array of liquid extraction openings in a linear arrangement, each of the liquid extraction openings having an elongate dimension in a direction different from that of the linear arrangement.

* * * * *

UNITED STATES PATENT AND TRADEMARK OFFICE
CERTIFICATE OF CORRECTION

PATENT NO. : 8,345,218 B2  
APPLICATION NO. : 12/437466  
DATED : January 1, 2013  
INVENTOR(S) : Michel Riepen et al.

Page 1 of 1

It is certified that error appears in the above-identified patent and that said Letters Patent is hereby corrected as shown below:

On Title page 2, item [56] References Cited - Other Publications, Column 2, Line 13
delete "U.S. 7,443,482, Oct. 26, 2010, Novak et al.,".

Signed and Sealed this
Sixteenth Day of April, 2013

Teresa Stanek Rea
*Acting Director of the United States Patent and Trademark Office*